US009722608B2

(12) United States Patent
Lazaravich (10) Patent No.: US 9,722,608 B2
(45) Date of Patent: Aug. 1, 2017

(54) MULTI-VOLTAGE TO ISOLATED LOGIC LEVEL TRIGGER

(71) Applicant: Mercury Systems, Inc., Chelmsford, MA (US)

(72) Inventor: Robert V. Lazaravich, Chandler, AZ (US)

(73) Assignee: Mercury Systems Inc., Chelmsford, MA (US)

(*) Notice: Subject to any disclaimer, the term of this patent is extended or adjusted under 35 U.S.C. 154(b) by 0 days.

(21) Appl. No.: 15/217,294

(22) Filed: Jul. 22, 2016

(65) Prior Publication Data

US 2017/0026043 A1 Jan. 26, 2017

Related U.S. Application Data

(60) Provisional application No. 62/195,776, filed on Jul. 22, 2015.

(51) Int. Cl.
| | | |
|---|---|---|
| *H03K 5/08* | (2006.01) | |
| *H03K 19/0185* | (2006.01) | |
| *G05B 19/05* | (2006.01) | |
| *H03K 17/68* | (2006.01) | |
| *H03K 17/795* | (2006.01) | |

(52) U.S. Cl.
CPC ... *H03K 19/018507* (2013.01); *G05B 19/054* (2013.01); *H03K 5/08* (2013.01); *H03K 17/68* (2013.01); *H03K 17/7955* (2013.01)

(58) Field of Classification Search
CPC .................. H03K 19/018507; H03K 5/08
See application file for complete search history.

(56) References Cited

U.S. PATENT DOCUMENTS 3,691,403 A * 9/1972 Reed ............... H03K 19/14
327/1
4,041,331 A * 8/1977 Westerman ......... H03K 17/79
327/455

(Continued)

FOREIGN PATENT DOCUMENTS

| CN | 201039071 | 3/2008 |
| GB | 2241126 | 8/1991 |

(Continued)

OTHER PUBLICATIONS

Notification of Transmittal of the International Search Report and the Written Opinion of the International Searching Authority, or the Declaration—Issued on Oct. 19, 2016 by the European Patent Office.

*Primary Examiner* — Kenneth B Wells
(74) *Attorney, Agent, or Firm* — Squire Patton Boggs (57) ABSTRACT

Various systems may benefit from interfaces for handling multiple types of inputs. For example, a device with a trigger input from an external device may benefit from an isolated logic level trigger that is capable of addressing multiple types and values of voltage. An apparatus can include an input configured to receive an external trigger input signal having a trigger input voltage. The apparatus can also include circuitry configured to automatically adjust the trigger input voltage to a value configured to be compatible with a provided attached system. A working range of the trigger input voltage can exceed a compatible working range of the provided attached system.

18 Claims, 5 Drawing Sheets

(56) References Cited

U.S. PATENT DOCUMENTS

| | | | | |
|---|---|---|---|---|
| 4,079,272 A | * | 3/1978 | Howatt | H03K 17/795 |
| | | | | 327/205 |
| 4,197,471 A | * | 4/1980 | Lackey | H03K 17/7955 |
| | | | | 326/21 |
| 4,507,571 A | * | 3/1985 | Callan | G01R 19/16576 |
| | | | | 307/650 |
| 5,019,995 A | * | 5/1991 | Saito | G01R 29/0273 |
| | | | | 324/76.11 |
| 5,270,577 A | * | 12/1993 | Yamaguchi | G05B 19/054 |
| | | | | 307/25 |
| 5,672,919 A | * | 9/1997 | Johnson | H01H 1/605 |
| | | | | 307/134 |
| 5,789,960 A | * | 8/1998 | Bower | G05B 19/054 |
| | | | | 327/319 |
| 6,202,171 B1 | | 3/2001 | Townsley | |

FOREIGN PATENT DOCUMENTS

| | | |
|---|---|---|
| JP | 2002014725 | 1/2002 |
| JP | 2008152309 | 7/2008 |
| JP | 2013134561 | 7/2013 |

\* cited by examiner

MULTI-VOLTAGE TO ISOLATED LOGIC LEVEL TRIGGER

CROSS REFERENCE TO RELATED APPLICATIONS

This application claims priority to U.S. Provisional Patent Application Ser. No. 62/195,776 filed Jul. 22, 2015, titled, "MULTI-VOLTAGE TO ISOLATED LOGIC LEVEL TRIGGER," the disclosure of which is fully incorporated herein by reference for all purposes.

DESCRIPTION OF THE INVENTION

Field of the Invention

Various systems may benefit from interfaces for handling multiple types of inputs. For example, a device with a trigger input from an external device may benefit from an isolated logic level trigger that is capable of addressing multiple types and values of voltage.

Background of the Invention

Some products have a need for input signals to activate, deactivate, or otherwise trigger certain features. For example, a secure solid state drive (SSD) may support an external trigger input that is configured to trigger a full drive erase function, a sanitize function, or a key erase function.

In certain cases, the SSD may use 3.3V or 1.8V logic. However, the external trigger signal provided by an associated device, such as a computer, may not be compatible with the 3.3V or 1.8V logic of the SSD. Moreover, there are a wide variety of different incompatible approaches.

SUMMARY OF THE INVENTION

According to certain embodiments, an apparatus can include an input configured to receive an external trigger input signal having a trigger input voltage. The apparatus can also include circuitry configured to automatically adjust the trigger input voltage to a value configured to be compatible with a provided attached system. A working range of the trigger input voltage can exceed a compatible working range of the provided attached system.

In certain embodiments, an apparatus can include means for receiving an external trigger input signal having a trigger input voltage. The apparatus can also include means for automatically adjusting the trigger input voltage to a value configured to be compatible with a provided attached system. A working range of the trigger input voltage can exceed a compatible working range of the provided attached system.

A method, according to certain embodiments, can include receiving, in a hardware device, an external trigger input signal having a trigger input voltage. The method can also include automatically adjusting, by the hardware device, the trigger input voltage to a value configured to be compatible with a provided attached system. A working range of the trigger input voltage can exceed a compatible working range of the provided attached system.

BRIEF DESCRIPTION OF THE DRAWINGS

For proper understanding of the invention, reference should be made to the accompanying drawings, wherein.

DETAILED DESCRIPTION

Certain embodiments can provide voltage translation from an external trigger input to an input suitable for a device, such as a solid state drive (SSD). Certain embodiments can provide such voltage without advance knowledge of the voltage characteristics of the external trigger input. For example, in different situations a different type or amount of translation may be needed.

Thus, in general, certain embodiments may translate an unknown externally applied positive or negative voltage to a value that an attached system can sense and react to without worries about over-voltage damage or voltage adjustment. Furthermore, certain embodiments may provide a robust method to translate a wide ranging input signal to a second voltage or logic level.

Figure 1:
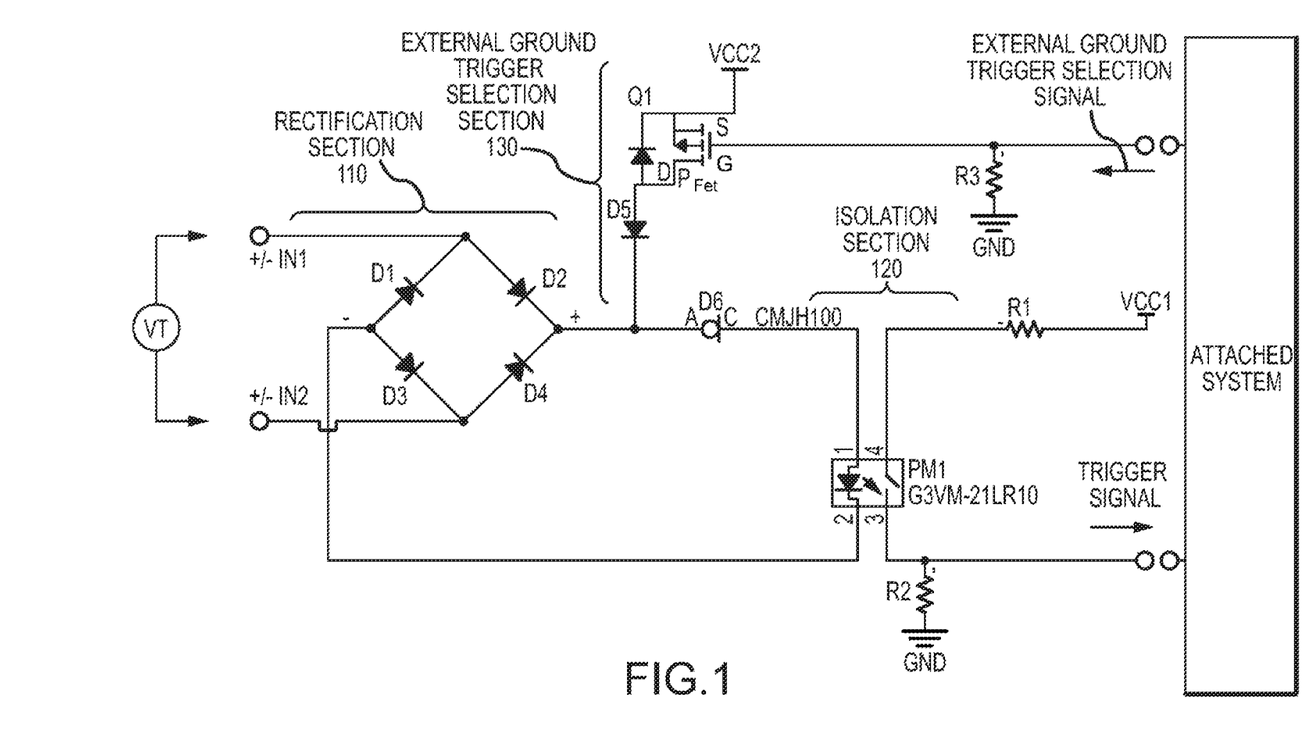
FIG. 1 illustrates a circuit diagram of an apparatus according to certain embodiments.

FIG. 1 illustrates a circuit diagram of an apparatus according to certain embodiments. As shown in FIG. 1, an apparatus can include an input IN1, IN2 configured to receive an external trigger input signal having a trigger input voltage VT. The apparatus can also include circuitry configured to automatically adjust the trigger input voltage to a value configured to be compatible with an attached system. The attached system can be any desired attached system, such as an SSD, attached to the right of the circuit.

The circuitry can include a rectification section 110. The rectification section 110 can be configured to adjust, for the trigger input voltage, at least one of a polarity or a current type. In some cases, the rectification section 110 can address both the polarity, such as negative or positive, and the type, such as alternating current or direct current. The rectification section 110 of the circuitry can include a full wave bridge rectifier, which can be made of diodes D1, D2, D3, D4.

The full wave bridge can adjust the input signal by selectively routing the input signals IN1 and IN2 so that the + point on the circuit diagram is always positive with respect to the − input on the circuit diagram. For example, the bridge can reverse the destination of the IN1 and IN2 signals so that the + point is always of the same polarity and the − point is always of the same polarity. The current can be routed as well by whichever pair of diodes in the bridge conduct, and routing may always present a positive voltage at the + point on the circuit diagram with respect to the − point on the circuit diagram. Thus, adjusting current can be accomplished by steering IN1 or IN2 to the same points regardless of the polarity of the voltage on IN1 or IN2.

Similarly, the full wave bridge can adjust the current type by rectifying alternating current into direct current. Optionally, a capacitor or other circuit element can be added to ensure that an output of the full wave bridge more closely approximates DC, although such approximation is not needed in certain embodiments.

The external trigger input signal can exhibit a trigger input voltage VT of any voltage from, for example, −50 V to +50 V. The external trigger input signal may exhibit a trigger input voltage VT as little as, for example, +/−2.5 V. The minimum may depend on diode drop in the rectification section 110, as well as on other aspects of the circuit design. Thus, in a particular example, D1, D2, D3, and D4 can form a low drop small signal full wave bridge to allow trigger input voltage VT from about +/−2.5 V to about +/−50 V (or any other desired voltage) to generate a trigger signal.

The circuitry can optionally include an external ground trigger selection section 130 arranged to enable generation of an output trigger signal responsive to grounding of either input IN1 or IN2, whenever an active external ground trigger selection signal is received, as will be further explained below. For example, the external ground trigger selection section 130 can include a switch Q1 configured to enable the output trigger signal responsive to grounding of either input IN1 or IN2 whenever the external ground trigger selection signal is low.

A purpose of the external ground trigger selection section 130 may be to allow either input IN1 or IN2 to cause a trigger if grounded. Low true signals may be desired. Thus, the external ground trigger selection section 130 may allow both IN1 or IN2 to cause a trigger signal if one or the other is grounded.

The external ground trigger selection signal can go to a low level with respect to VCC2 to turn on a PFET Q1. When Q1 turns on, Q1 can apply VCC2 to a current limiting diode D6 via a diode D5. When D6 is forward biased, current can flow through an LED in PM1 and then out D1 or D3 to IN1 or IN2 or both depending on which is low. If neither IN1 nor IN2 is at a low level, then there will be no current in the LED of PM1, and because there is no current flowing, the trigger signal will not occur. Thus, current may flow through the LED in PM1 to generate a trigger signal.

Q1 could also be replaced by an inverter, or other digital logic, or a buffer. A FET, however, uses no power when the external ground trigger selection signal is in a high state, but an inverter or buffer would always burn a small amount of power.

In summary, the state of the external ground trigger selection signal can change the operation of the circuit to allow the user to use low true logic, grounding of IN1 or IN2, at IN1 or IN2 or even both grounded at the same time. This principle can also allow the generation of a trigger signal from an external source that has two different conditions that may be needed in alternative configurations to generate the trigger signal.

VCC1 for PM1 can be different from VCC2 for Q1. VCC1 for PM1 may be the desired VCC that the logic on the right side, fed by the trigger signal, can use for its main supply voltage. VCC2 for Q1 could be any value. If VCC2 for Q1 is too high, then the logic that generates the external ground trigger selection signal may need translation to be able to turn on and turn off FET Q1. FET Q1 is a P channel FET in this particular example, but could be an N channel FET or a logic buffer or a logic buffer with an open collector/drain output. Q1 can be provided as a way to generate the current needed to turn on the LED in PM1 whenever IN1 or IN2 is grounded.

As shown in FIG. 1, the external ground trigger selection section 130 may receive the external ground trigger selection signal across a resistor R3, and at the gate of a switch Q1. Resistor R3 may keep the external ground trigger selection signal low if the external ground trigger selection signal is left floating, and thus in the absence of a trigger selection signal connected thereto creates a default condition allowing the user to use low true logic, i.e. grounding of IN1 or IN2, to initiate the trigger signal. In an alternative embodiment, resistor R3 may be connected to VCC2 of switch Q1 resulting in default of requiring an active signal on IN1 or IN2 to initiate the trigger signal. Switch Q1 can be a p-channel field-effect transistor (PFET) switch for the external ground trigger selection option. VCC2 can be the digital supply used in the digital system. Diode D5 can prevent reverse current from entering the body diode of Q1, when trigger input voltage VT is actively provided.

The external ground trigger selection signal may provide a non-isolated external ground trigger option. A one or high signal may indicate that the option is off. A zero or low signal may indicate the option is on, and may enable the output trigger signal responsive to grounding of either input IN1 or IN2, when selected.

The circuit can have at least two modes of operation. In one mode, D5 and Q1 may not be needed. In this mode, a high level on IN1 in relation to IN2, or vice versa, can generate a trigger signal. For example, in this mode, IN1 can be 2.5V or greater and IN2 can be ground to generate a trigger signal. Alternatively, IN2 could be 2.5V or greater and IN1 can be grounded to generate a trigger signal.

In a second mode of operation, the circuit can allow the user to ground either IN1 or IN2 to cause the trigger signal. In the second mode of operation, the current needed to turn on the LED inside relay PM1 can come from D5 and Q1, responsive to the external ground trigger selection signal, or from another circuit (see, for example, FIGS. 3 and 4).

Driving the external ground trigger selection signal to a high level can enable the first mode. Alternatively, driving the external ground trigger selection signal to a low level, or leaving the trigger selection signal floating, can enable the second mode.

In the second mode of operation, the external ground trigger selection signal can be driven low to turn on the Q1 P-channel FET. When Q1 is on, Q1 can supply a current to PM1, but only when either IN1, or IN2, or both are grounded. If both IN1 and IN2 are floating or at a higher voltage potential than VCC2, PM1 will not trigger because current will not flow through the LED in PM1.

Figure 4:
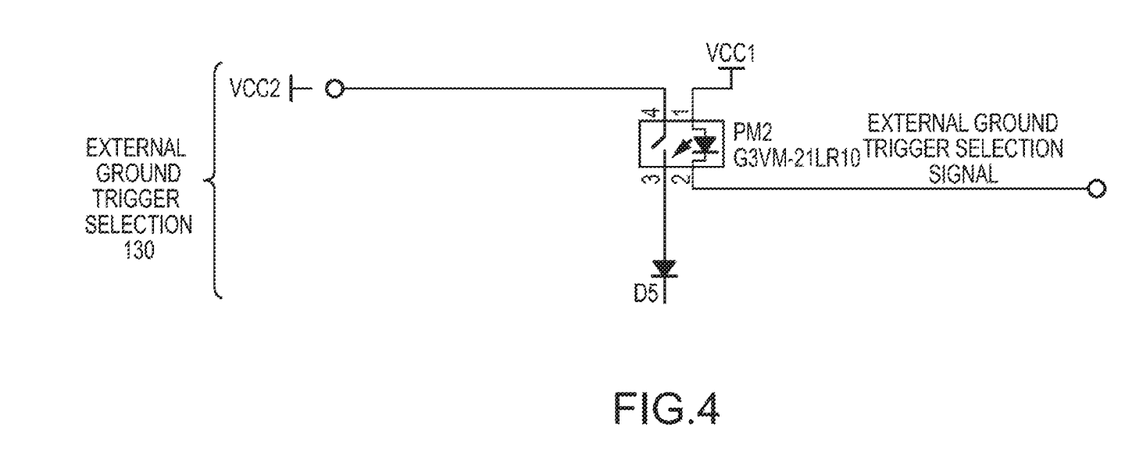
FIG. 4 illustrates an alternative for an external ground trigger selection section, according to certain embodiments.

In the second mode of operation, ground may be the same on both sides of isolation section 120, as shown. There are alternatives to this use of the same ground if, for example, another relay PM2 were used to supply VCC2 to D6, as shown in FIG. 4. In this fashion, PM2 would interface the external ground trigger selection signal so that it can use an isolated VCC2.

An alternative approach would be to eliminate Q1 and R3 and let the external ground trigger selection signal directly drive D5. Other approaches or embodiments are also permitted.

The circuitry can also include an isolation section 120 configured to isolate the trigger input voltage VT from the attached system. The isolation section 120 can include a relay PM1 configured to selectively provide the output trigger signal in response to an output of the rectification section 110.

Relay PM1 can be a solid state relay, such as a photoMOS relay. This device can be a single device that may include an LED that illuminates a pair of photo sensitive/triggered MOSFETs. The two MOSFETs in PM1 can form the switch shown in the circuit. A photo diode can similarly work for PM1 if a light emitting diode (LED) is supplied to illuminate the photodiode. For example, PM1 could also be constructed with individual photo FETs and/or photodiodes and an LED to turn on the photo FETs or photodiode. Other implementations are also permitted.

Thus, relay PM1 can be a photoMOS relay which advantageously acts to optically isolate and filter the VT trigger input signal. PM1 can receive VCC1 via resistor R1 at a first output lead, where resistor R1 can be an optional current limit for the output trigger signal provided at the second output lead of relay PM1. VCC1 is the voltage compatible with the attached device, preferably provided from the attached device. Furthermore, the second output lead of relay PM1 can be attached to a first end resistor R2, with the second end of resistor R2 connected to a common potential or ground of the attached device, which can keep the output trigger signal low until a valid external trigger input signal is detected. There is no requirement that the common potential of the attached device be the same as the common potential of external ground trigger selection signal, and the common potentials may be totally isolated from each other without exceeding the scope. The output trigger signal can provide an isolated and translated logic level trigger signal. For example, a 0 or low output trigger signal can indicate that no VT trigger input is detected. Alternatively, a 1 or high signal can indicate that the output trigger signal is generated. Advantageously, the high signal is voltage compatible with the attached device, since VCC1 of the attached device is utilized for the generation of the output trigger signal.

The circuitry can also include a current limiting diode D6 between the rectification section 110 and the isolation section 120. D6 can be a current limiting diode selected to limit current into PM1 under all trigger input voltage conditions.

In view of the above, the isolation section 120 can include a first side (shown, to the left of PM1) electrically connected to the rectification section 110 and a second side (shown to the right of PM1) electrically connected to the attached system, in which the first side can be electrically isolated from the second side. In the embodiment shown a first lead of the first side of PM1 is coupled to the positive output of the rectification section 110, optionally via current limiting diode D6, and a second lead of the first side of PM1 is coupled to the return of the rectification section 110.

In view of the above, certain embodiments can provide circuitry configured to automatically adjust a trigger input voltage to a value configured to be compatible with a provided attached system. This circuitry can include the isolation section 120 as well as optionally the rectification section 110 and further optionally the current limiting diode D6. This circuitry can optionally further include R1 and R2, as explained above.

Figure 2:
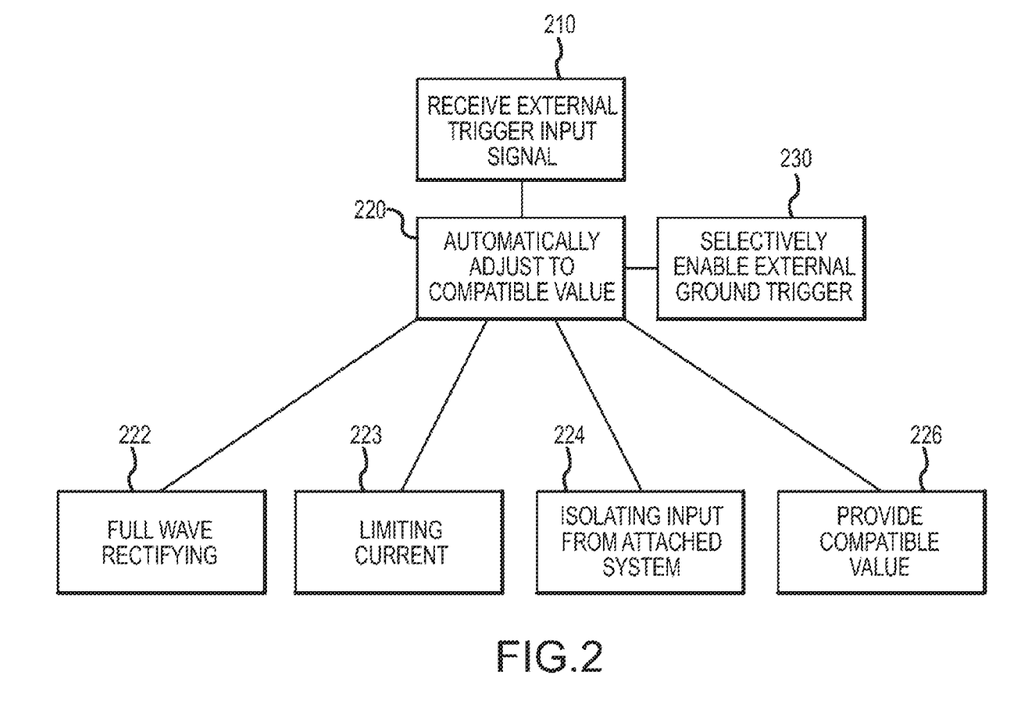
FIG. 2 illustrates a method according to certain embodiments.

FIG. 2 illustrates a method according to certain embodiments.

As shown in FIG. 2, a method can include, at 210, receiving an external trigger input signal having a trigger input voltage. The method can also include, at 220, automatically adjusting the trigger input voltage to a value configured to be compatible with an attached system. For example, the automatic adjustment can include adjusting, for the trigger input voltage, at least one of a polarity or a current type. The current type may be, for example, DC or AC. This adjustment can be in addition to adjusting a voltage level of the trigger input voltage.

The automatic adjusting can include, at 222, full wave rectifying. The method can also include, at 230, selectively enabling an external ground trigger.

The method can also include, at 224, isolating the trigger input voltage from the attached system. The method can further include, at 226, providing a compatible input signal in response to an output of circuitry for performing the adjusting at 220. The compatible input signal may be compatible, for example, in terms of having an appropriate voltage, current type, polarity, or the like to be used by the attached system. For example, if the attached system requires a 3.3 V or 1.8 V voltage level, circuitry can be configured to supply the compatible input signal respectively at a 3.3 V or 1.8 V voltage level.

The method can include, at 223, limiting current between the adjusting and the isolating. The isolating can involve providing a first side electrically connected to circuitry for performing the adjusting at 220 and a second side electrically connected to the attached system, wherein the first side is electrically isolated from the second side.

Various embodiments may have a variety of features. For example, the voltage for the external trigger input signal (VT) can be any voltage from +/− (2.5 V to 50 V) or any other desired voltage. The circuit can adjust to the trigger input voltage automatically and can translate the input voltage to a value determined by the VCC of the attached system.

In certain embodiments, the polarity of the external trigger input can be automatically adjusted by a full wave bridge, such as a small signal full wave bridge. Thus, the trigger input signal VT, can be positive, negative, DC or AC.

In certain embodiments, the bridge can be created from small diodes, as opposed to big bulky rectifier diodes. The diodes in the bridge can, alternatively, be replaced with the body/drain diode of a MOSFET in an ideal diode type circuit. This would allow another circuit to turn on the associated FET to eliminate the drop of the diode. This may effectively lower the minimum operation voltage from +/−2.5V to near 0 V.

The relay PM1 can provide opto-isolation. Thus, the trigger input signal need not share the same ground reference as the logic in the attached device.

The trigger input signal may not require current limiting. The circuit can include a constant current diode that automatically limits the input current to a pre-selected maximum limit. The constant current diode can permit the circuit to operate over a very wide voltage range.

Certain embodiments may eliminate the chance of accidental triggering of the circuit by floating pins or noise bursts. The relay PM1 may be configured to require a current to flow for a period of time before the LED will illuminate and generate the output trigger signal.

The photoMOS relay PM1 can provide automatic filtering of the trigger input signal VT to account for possible bouncing contacts. The filtering can come from the amount of time that the trigger input signal needs to remain applied before the LED in the photoMOS relay builds up enough charge to turn on the FET inside the photoMOS relay. The filtering time can be adjusted to longer or shorter durations by selecting a current limiting diode D6 with a higher or lower pass current or by selecting a different IR LED/photodetector device.

In certain embodiments, the circuit may have an option to generate the trigger signal by externally grounding either or both IN1 or IN2 inputs. It is not necessary to ground both IN1 or IN2 inputs. For example, it may be adequate that they are sufficiently low in relation to VCC2.

There can be various implementations of certain embodiments. For example, the current limiting diode can be made using a junction gate field-effect transistor (JFET) with an appropriately selected gate/source short current ($I_{DSS}$). The gate and source of the JFET can be connected together to create a current limiting diode. The photoMOS relay PM1 can be made from an infrared (IR) light emitting diode (LED) and a high speed photo detector/switch.

Figure 3:
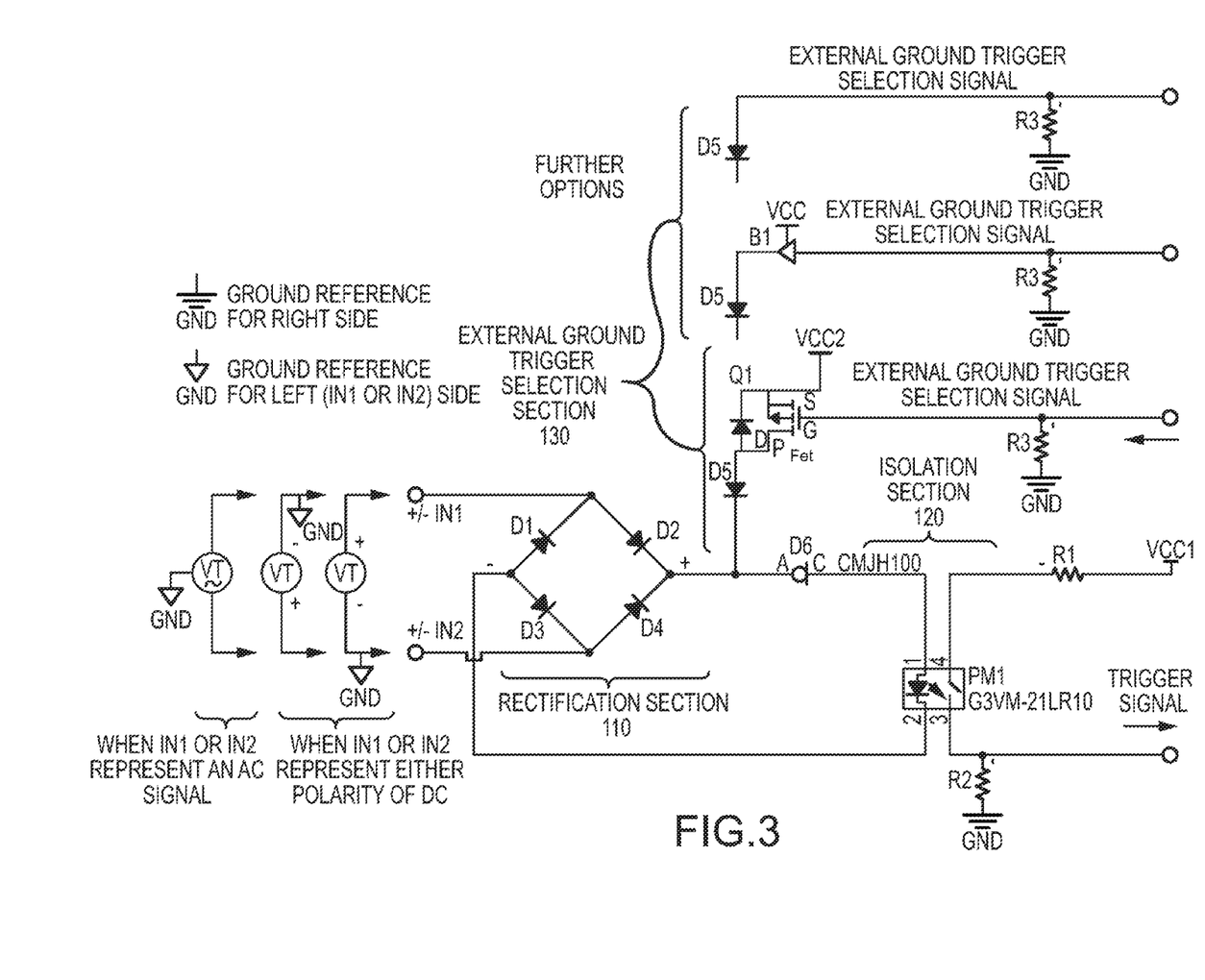
FIG. 3 illustrates a circuit diagram of an apparatus in several variations according to certain embodiments.

FIG. 3 illustrates a circuit diagram of an apparatus in several variations according to certain embodiments. As shown in FIG. 3, the circuit can include a rectification section 110, an isolation section 120, and an external ground trigger selection section 130, as shown in FIG. 1. Other similar parts can also be provided, as shown in FIG. 1. FIG. 3 also shows several further options.

For example, as shown at the left of FIG. 3, there can be multiple options for the input voltage VT. The input voltage can, from left to right, be an alternating current source, a DC source with IN1 grounded, or a DC source with IN2 grounded. As shown in FIG. 3, the bridge in rectification section 110 can route IN1 to the + terminal of the bridge when IN1 is greater than IN2 and can route IN2 to the + terminal of the bridge when IN2 is greater than IN1.

Additionally, as shown at the top of FIG. 3, there can be multiple options for the external ground trigger selection section 130. The bottom option shown in FIG. 3 is the same as shown in FIG. 1. The middle option omits Q1 and instead provides an amplifier B1 arranged to amplify and/or buffer the external ground trigger selection signal. In this case, diode D5 can prevent reverse current from entering the output of amplifier B1 when VT is driving the trigger input voltage.

The top option can omit Q1 and B1 and instead the external ground trigger selection signal can be directly applied through D5. In this case, diode D5 can prevent reverse current from flowing into the external ground trigger selection signal source when VT is driving the trigger input voltage.

In the bottom and middle options, VCC2 does not need to be the same as VCC1, although they can be the same, if desired. VCC1 can be the digital supply used in the attached digital system. VCC2 can be used as a source of LED current to turn on the LED in PM1 when in the second mode of operation, as described above.

The ground reference for the side of the circuit toward the attached system can be independent from the ground reference for the side of the circuit toward the external ground trigger selection signal. Thus, the ground references can be different on either side of PM1. Additionally, while the ground reference for R3 is shown as being the same as the ground reference for R2, in certain embodiments these two right side ground references can be different from one another. For example, in certain embodiments the ground reference for R3 can be the same as the left side ground reference or may also be different from the left side ground reference.

The external ground trigger selection signal can be configured such that low or zero value of the external ground trigger selection signal provides that the option is on, whereas one or high value of the external ground trigger selection signal indicates that the external ground trigger selection option is disabled. Alternatively, the external ground trigger selection signal can be configured such that low or zero value of the external ground trigger selection signal provides that the option is disabled, whereas one or high value of the external ground trigger selection signal indicates that the external ground trigger selection option is enabled.

FIG. 4 illustrates an alternative for an external ground trigger selection section 130, according to certain embodiments. As shown in FIG. 4, an external ground trigger selection section 130 can be designed to increase isolation between the left and right sides of the circuit. For example, another photoMOS relay PM2 can be provided, for example, to avoid electrical interaction between the left and right sides of the circuit. Relay PM2 can be configured to provide VCC2 to D5 when the external ground trigger selection signal goes sufficiently below VCC1, such as when the external ground trigger selection signal is brought to a right side ground value. In this embodiment, D5 can prevent reverse current from affecting PM2. In certain embodiments, D5 can be omitted.

Figure 5:
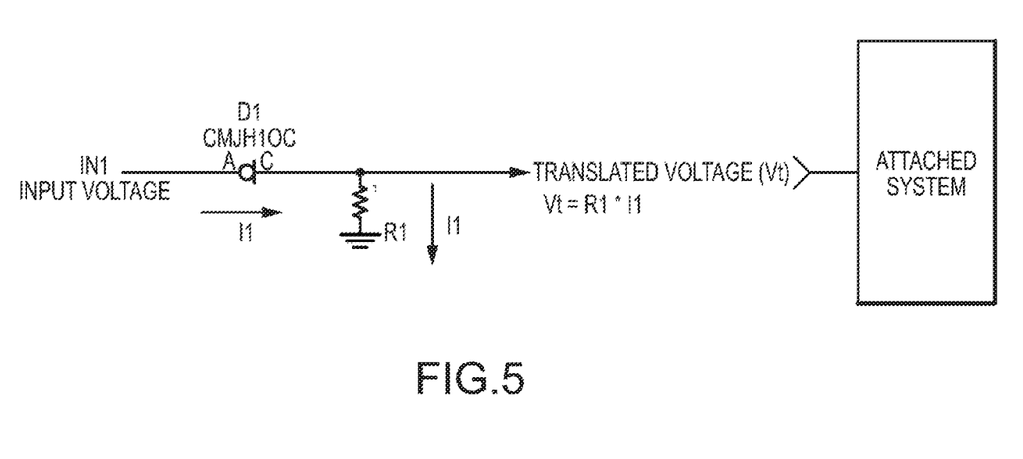
FIG. 5 illustrates a voltage translation circuit according to certain embodiments.

FIG. 5 illustrates a voltage translation circuit according to certain embodiments. As shown in FIG. 5, an input voltage IN1 can be applied to an input of current-limiting diode D1. Diode D1 can limit the current to maximum current I1. Resistor R1 provided between diode D1 and ground can provide a translated voltage Vt, where the value in volts of voltage Vt is determined by the value in amps of the maximum current I1 and the value in ohms of resistor R1. Thus, the output of the current limiting diode D1 can be configured to provide voltage Vt, which is controlled by the maximum current I1 of the current limiting diode D1 and the resistance of the resistor R1. The translated voltage Vt can be provided to an attached system.

In FIGS. 1 and 3-5, various part numbers are shown. These part numbers are merely illustrative of a particular example, and should not be taken as limiting the scope of the invention. Additionally, the input voltage in certain embodiments is described as a trigger voltage. Nevertheless, other embodiments may apply to voltages that have other functions than triggering. Consequently, the above-described circuits may be broadly applied to many voltage translation or voltage conditioning scenarios without being limited to the examples set forth above. Other input voltages may be digital logic levels, sensors outputs, a line configured to drive a motor or similar equipment, or the like.

Certain embodiments may have various benefits and/or advantages. For example, in certain embodiments a device may be constructed from a small number of physical components, which may permit ease of manufacture.

One having ordinary skill in the art will readily understand that the invention, as discussed above, may be practiced with steps in a different order, and/or with hardware elements in configurations which are different than those which are disclosed. Therefore, although the invention has been described based upon these disclosed embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. An apparatus, comprising:
an input configured to receive an external trigger input signal having a trigger input voltage; and
circuitry configured to automatically adjust the trigger input voltage to a value configured to be compatible with a provided attached system, wherein the circuitry comprises a current limiting device;
wherein a working range of the trigger input voltage exceeds a compatible working range of the provided attached system; and
wherein the circuitry further comprises an external ground trigger selection section.

2. The apparatus of claim 1, wherein the circuitry comprises a rectification section, wherein the rectification section is configured to adjust, for the trigger input voltage, at least one of a polarity or a current type.

3. The apparatus of claim 2, wherein the rectification section of the circuitry comprises a full wave bridge rectifier.

4. The apparatus of claim 1, wherein the external ground trigger selection section comprises a switch configured to enable an external ground trigger when selected.

5. The apparatus of claim 2, wherein the circuitry comprises an isolation section configured to isolate the trigger input voltage from the provided attached system.

6. The apparatus of claim 5, wherein the isolation section comprises a photodiode configured to selectively provide a compatible input signal in response to an output of the rectification section.

7. The apparatus of claim 6, wherein the isolation section comprises a PhotoMOS relay comprising the photodiode.

8. The apparatus of claim 5, wherein the current limiting device comprises a current limiting diode disposed between the rectification section and the isolation section.

9. The apparatus of claim 5, wherein the isolation section comprises a first side electrically connected to the rectification section and a second side electrically connected to the provided attached system, wherein the first side is electrically isolated from the second side.

10. An apparatus, comprising:
means for receiving an external trigger input signal having a trigger input voltage;
means for automatically adjusting the trigger input voltage to a value configured to be compatible with a provided attached system; and
means for selectively enabling an external ground trigger; and
means for limiting current from the trigger input signal,
wherein a working range of the trigger input voltage exceeds a compatible working range of the provided attached system.

11. The apparatus of claim 10, further comprising:
means for adjusting, for the trigger input voltage, at least one of a polarity or a current type.

12. The apparatus of claim 11, wherein the means for adjusting comprises means for full wave rectifying.

13. The apparatus of claim 11, further comprising:
means for isolating the trigger input voltage from the provided attached system.

14. The apparatus of claim 13, further comprising:
means for selectively providing a compatible input signal in response to an output of the means for adjusting.

15. The apparatus of claim 13, further comprising:
means for limiting current between the means for adjusting and the means for isolating.

16. The apparatus of claim 13, wherein the means for isolating comprises a first side electrically connected to the means for adjusting and a second side electrically connected to the provided attached system, wherein the first side is electrically isolated from the second side.

17. A method, comprising:
receiving, in a hardware device, an external trigger input signal having a trigger input voltage;
automatically adjusting, by the hardware device, the trigger input voltage to a value configured to be compatible with a provided attached system;
selecting an external ground trigger; and
limiting current from the trigger input signal,
wherein a working range of the trigger input voltage exceeds a compatible working range of the provided attached system.

18. The method of claim 17, further comprising:
isolating the trigger input voltage from the provided attached system.

* * * * *